United States Patent
Magesacher et al.

(10) Patent No.: US 9,484,962 B1
(45) Date of Patent: Nov. 1, 2016

(54) DEVICE AND METHOD FOR ADAPTIVE DIGITAL PRE-DISTORTION

(71) Applicant: Infineon Technologies AG, Neubiberg (DE)

(72) Inventors: Thomas Magesacher, Villach (AT); Peter Singerl, Villach (AT); Martin Mataln, Velden (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/731,586

(22) Filed: Jun. 5, 2015

(51) Int. Cl.
*H04L 5/00* (2006.01)
*H04B 1/04* (2006.01)

(52) U.S. Cl.
CPC .......... *H04B 1/04* (2013.01); *H04B 2001/0425* (2013.01)

(58) Field of Classification Search
CPC ..... H04L 5/00; H04L 27/367; H04L 27/368; H04B 1/00; H04B 15/00; H04B 2001/0425; H04B 1/62; H04B 2001/0433; H03F 1/3247; H03F 2201/3233; H03F 2201/3224; H03F 1/3258; H03F 1/3241
USPC ................................................. 375/295–297
See application file for complete search history.

(56) References Cited

U.S. PATENT DOCUMENTS

| | | | | |
|---|---|---|---|---|
| 5,107,520 A * | 4/1992 | Karam | ............... | H03F 1/3252 332/123 |
| 6,072,364 A * | 6/2000 | Jeckeln | ............... | H03F 1/3247 330/149 |
| 7,269,231 B2 * | 9/2007 | Ding | ............... | H03F 1/3247 375/284 |
| 7,688,138 B2 * | 3/2010 | Hehn | ............... | H03F 1/3247 330/149 |
| 7,737,779 B2 * | 6/2010 | Summerfield | ............... | H03F 1/3247 330/149 |
| 7,741,906 B1 * | 6/2010 | Summerfield | ............... | H03F 1/3247 330/149 |
| 7,873,172 B2 * | 1/2011 | Lashkari | ............... | H03F 1/3264 381/59 |
| 8,046,199 B2 * | 10/2011 | Copeland | ............... | H03F 1/3247 703/2 |
| 8,204,210 B2 * | 6/2012 | Van De Laar | ............... | H04M 9/082 379/406.1 |
| 8,331,487 B2 * | 12/2012 | Yu | ............... | H03F 1/3241 375/296 |
| 8,354,884 B2 * | 1/2013 | Braithwaite | ............... | H03F 1/3247 330/149 |
| 8,536,943 B2 * | 9/2013 | Irvine | ............... | H03F 1/3247 330/126 |
| 8,548,403 B2 * | 10/2013 | Kim | ............... | H03F 1/3247 455/114.3 |

(Continued)

OTHER PUBLICATIONS

Kim, et al. "Digital predistortion of wideband signals based on power amplifier model with memory." Electronics Letters, vol. 37, No. 23, Nov. 8, 2001.

(Continued)

*Primary Examiner* — Emmanuel Bayard
(74) *Attorney, Agent, or Firm* — Eschweiler & Associates, LLC (57) ABSTRACT

One embodiment relates to a system which includes a pre-distortion unit, a power amplifier circuit, a power amplifier model, and a parameter estimation unit. The pre-distortion unit is configured to pre-distort an input signal based on a model parameter by directly computing the model inverse in an iterative fashion, thereby providing a pre-distorted signal. The power amplifier circuit is configured to amplify the pre-distorted signal. The power amplifier model is configured to model amplification of the pre-distorted signal by the power amplifier circuit based on the pre-distorted signal and the model parameter. Based on the pre-distorted signal and an error signal, the parameter estimation unit is configured to update the model parameter provided to the pre-distortion unit and the power amplifier model. The error signal represents a difference between an output signal from the power amplifier circuit and a modeled output signal from the power amplifier model.

20 Claims, 4 Drawing Sheets

(56) References Cited

U.S. PATENT DOCUMENTS

| | | | | | |
|---|---|---|---|---|---|
| 8,654,889 | B2* | 2/2014 | Kumar | | H03F 1/3258 330/149 |
| 8,665,931 | B2* | 3/2014 | Afsahi | | H03F 1/0222 375/219 |
| 9,014,299 | B2* | 4/2015 | Teterwak | | H04L 1/0033 375/296 |
| 9,077,409 | B2* | 7/2015 | Lozhkin | | H04B 1/0475 |
| 9,136,887 | B2* | 9/2015 | Zhao | | H04B 1/0475 |
| 9,143,091 | B2* | 9/2015 | Oishi | | H03F 3/24 |
| 9,184,784 | B2* | 11/2015 | Ding | | H04B 1/62 |
| 9,246,731 | B2* | 1/2016 | Kim | | H03F 1/3247 |
| 9,252,821 | B2* | 2/2016 | Shor | | H04B 1/0475 |
| 2001/0007435 | A1* | 7/2001 | Ode | | H03F 1/3247 330/149 |
| 2002/0044014 | A1* | 4/2002 | Wright | | H03F 1/3241 330/2 |
| 2002/0190787 | A1 | 12/2002 | Kim et al. | | |
| 2003/0058959 | A1* | 3/2003 | Rafie | | H03F 1/3247 375/296 |
| 2005/0242876 | A1* | 11/2005 | Obernosterer | | H03F 1/3294 330/149 |
| 2007/0033000 | A1* | 2/2007 | Farahani | | G06F 17/11 703/28 |
| 2010/0311360 | A1* | 12/2010 | Huang | | H03F 3/24 455/114.3 |
| 2013/0165060 | A1* | 6/2013 | Jian | | H03H 11/04 455/114.3 |
| 2014/0133602 | A1* | 5/2014 | Mujica | | H03F 1/3247 375/297 |
| 2014/0167845 | A1* | 6/2014 | Brown | | H03F 1/26 330/149 |
| 2014/0294120 | A1* | 10/2014 | Gandhi | | H03F 1/3241 375/297 |
| 2014/0333376 | A1* | 11/2014 | Hammi | | H03F 1/3258 330/149 |
| 2015/0162881 | A1* | 6/2015 | Hammi | | H03F 3/189 330/291 |
| 2015/0163079 | A1* | 6/2015 | Rollins | | H04L 27/368 375/296 |
| 2015/0214904 | A1* | 7/2015 | Lozhkin | | H03F 1/3247 330/75 |
| 2015/0236731 | A1* | 8/2015 | Ghannouchi | | H04B 1/0475 375/296 |
| 2015/0357975 | A1* | 12/2015 | Avniel | | H03F 1/0277 330/310 |
| 2016/0028433 | A1* | 1/2016 | Ding | | H04B 1/62 375/297 |
| 2016/0065147 | A1* | 3/2016 | Pratt | | H03F 1/3247 330/75 |
| 2016/0065249 | A1* | 3/2016 | Yang | | H04B 1/04 375/297 |

OTHER PUBLICATIONS

Kokkeler, A.B.J. "Modeling Power Amplifiers using Memory Polynomials." 12th Annual Symposium of the IEEE/CVT, Enschede, the Netherlands, Nov. 3, 2005.

* cited by examiner

DEVICE AND METHOD FOR ADAPTIVE DIGITAL PRE-DISTORTION

BACKGROUND

In power amplifier design, there is a trade-off between efficiency and distortion. Amplifiers that operate under "Class A" conditions create little distortion but are inefficient, whereas amplifiers operated under "Class C" conditions are reasonably efficient but introduce significant signal distortion. For example, "Class C" power amplifiers often operate in a non-linear fashion whereby input signals are distorted at a power amplifier's output when operated near the power amplifier's peak output. While both efficiency and distortion are important considerations in amplifier design, efficiency becomes increasingly important at high power levels. Because of this, designers of many modern transmitters elect to accept some non-linearity in their power amplifiers to obtain good efficiency.

To attempt to limit this non-linearity and its corresponding distortion, various linearization techniques are used in conventional approaches. Conventional linearization techniques can be broadly categorized as feedback, feed-forward, or pre-distortion. The last mentioned technique, pre-distortion, intentionally distorts the input signal before the power amplifier to compensate in anticipation of the expected non-linearity of the power amplifier. According to this technique, linearization is achieved by distorting an input signal according to a pre-distortion function in a manner that is inverse to the amplifier behavior. The pre-distortion technique can be applied at radio frequency (RF), intermediate frequency (IF), or at baseband.

Existing pre-distortion techniques are less than optimal, however, and there is a need for power amplifier systems that provide improved pre-distortion functionality.

BRIEF DESCRIPTION OF THE DRAWINGS

The following description and annexed drawings set forth in detail certain illustrative aspects and implementations of the invention. These are indicative of but a few of the various ways in which the principles of the invention may be employed.

DETAILED DESCRIPTION

The present invention will now be described with respect to the accompanying drawings in which like numbered elements represent like parts. The figures and the accompanying description of the figures are provided for illustrative purposes and do not limit the scope of the claims in any way.

The present disclosure provides for improved transmission systems that use pre-distortion to improve the linearity of non-linear devices. Examples of such non-linear devices can include power amplifiers, such as in wireless base stations; line drivers in wireline transceivers, electro-to-optical converters for optical-fiber communication transceivers, power-amplifier test and characterization equipment.

Figure 1:
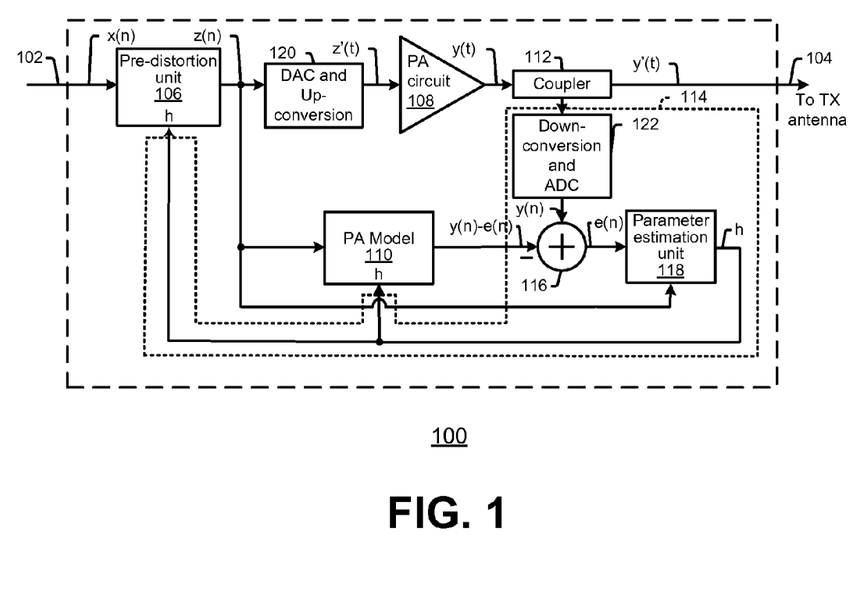
FIG. 1 illustrates a transmission system with improved adaptive pre-distortion in accordance with some embodiments.

FIG. 1 shows an example of a transmission system 100 with improved adaptive pre-distortion in accordance with some embodiments. The transmission system 100 includes a system input 102, at which an input signal, x(n), such as a complex digital baseband signal, is received. The system 100 also has a system output 104, at which an output signal, y'(t), such as an intermediate frequency (IF) or RF signal, is provided. Ideally, the output signal, y'(t), has the same signal characteristics as the input signal, x(n), but at IF or RF and with amplified magnitude. Whereas conventional output signals are often amplified in a non-linear fashion (whereby the output signal may be undesirably compressed at larger signal magnitudes, due to saturation for example), as will be appreciated in more detail herein, the system 100 can exhibit substantially linear amplification due to adaptive pre-distortion techniques provided herein. Thus, compared to conventional approaches where the magnitude of the output signal may be distorted in a non-linear manner over time, system 100 limits the amount of signal distortion injected into the output signal and thereby improves signal quality in the system.

To achieve this behavior, the transmission system 100 includes a pre-distortion unit 106, a power amplifier circuit 108, and a power amplifier model 110, wherein the power amplifier model 110 models amplification of signals by the power amplifier circuit 108 using a mathematical model, such as a polynomial approximation. A coupler 112 diverts a tiny fraction of the RF output signal, y'(t), back onto a feedback path 114 yielding the baseband feedback signal y(n), while almost all the power of the output signal continues to output 104 and a transmission (TX) antenna. The feedback path 114 extends from the coupler 112 back to the pre-distortion unit 106 and the power amplifier model 110. The feedback path 114 includes a comparator 116 and a parameter estimation unit 118. The comparator 116 has a first comparator input coupled to the output of the coupler 112, a second comparator input coupled to an output of the power amplifier model 110, and a comparator output to provide an error signal, e(n), to an input of the parameter estimation unit 118.

An example of operation of system 100 is now described. During a first time period, the input signal x(n) is provided to input of pre-distortion unit 106, and the pre-distortion unit 106 pre-distorts the input signal, x(n), based on model parameter, h, thereby providing a pre-distorted signal, z(n), at an output of pre-distortion unit 106. This pre-distorted signal, z(n), which is typically a digital signal, is then converted to an analog signal by a digital to analog converter (DAC) and the frequency of this analog signal is then up-converted by up-conversion element in block 120. The power amplifier circuit 108 amplifies the up-converted, pre-distorted signal, z'(t), thereby providing the output signal y(t). Ideally, the output signal, y(t), would be a linearly amplified (and analog up-converted) version of the input signal, x(n), but in actuality, the output signal y(t) during the first time period can show some additional non-linearity, such as compression or saturation (e.g., undershoot) for signal peaks, for example.

A significant portion of the power of the output signal, y(t), is transmitted through the output 104 to the TX antenna as shown by output signal y'(t), but coupler 112 diverts a small portion of the output signal power to feedback path 114 for analysis. The feedback path 114 down-converts the output signal and converts this signal to a digital signal using down-conversion and ADC element 122, thereby yielding baseband feedback signal y(n). The comparator 116 compares the baseband feedback signal, y(n), to a modeled output signal, y(n)-e(n), from power amplifier model 110, thereby providing error signal, e(n). This error signal, e(n), represents a difference between the baseband feedback signal y(n) and corresponding points on modeled output signal curve, y(n)-e(n). Based on both the error signal, e(n), and the pre-distorted signal, z(n); the parameter estimation unit 118 updates the model parameter(s), h, by an amount dh, and the updated model parameter, h, is then fed back to the pre-distortion unit 106 and the power amplifier model 110.

To compensate for non-linearity in the power amplifier circuit 108, the parameter estimation unit 118 iteratively updates the model parameter, h, and uses this model parameter, h, to tune both the power amplifier model 110 and the pre-distortion unit 106 in a manner that minimizes the error signal, e(n), using a least-squares estimation. In this way, as time goes on, the baseband feedback signal y(n) and more importantly the output signal, y'(t), become more linear with regards to the input signal, x(n) (i.e., error, e(n), becomes smaller over time). For example, during the first time period, the modeled power amplifier output, y(n)-e(n), is a linear amplified version of the input signal, x(n), but the baseband feedback signal, y(n), can undershoot the modeled output signal y(n)-e(n) due to saturation of the power amplifier circuit 108. The parameter estimation unit 118 updates the model parameter, h, to slightly increase the magnitude of the pre-distorted signal, z(n), relative to the input signal x(n) for a second time period, which is after the first time period. Thus, because the pre-distortion unit 106 and power amplifier model 110 each receive an updated model parameter h for the second time period, the baseband feedback signal y(n) is much closer to the power amplifier model output signal, y(n)-e(n), for the second time period, and the error signal, e(n), is reduced relative to the first time period. This feedback continues in an ongoing manner, and after several update periods, the baseband feedback signal, y(n), is a substantially linearly amplified version of the input signal, x(n). Thus, the pre-distortion unit 106 pre-distorts the input signal x(n) based on model parameter h by directly computing an inverse of the power amplifier model 110 in an iterative fashion. The pre-distortion unit 106 alternates between computing the inverse of the power amplifier model 110 and updating the model parameter h, thereby providing a pre-distorted signal z(n).

It will be appreciated that the disclosed adaptive pre-distortion techniques can use a segment-wise piecewise-polynomial approximation. Thus, the amplitude range is divided into a number of amplitude segments, and the model parameter h, is successively updated for these amplitude segments. The pre-distortion unit and power amplifier model can use polynomials that are continuous and differentiable within each amplitude segment and may or may not have "kinks" at the amplitude segment boundaries (depending on the polynomial orders). The model parameter is updated for each amplitude segment, and the pre-distortion unit and power amplifier model use polynomials within the amplitude segments where the polynomial order can vary from amplitude segment to amplitude segment depending on the behavior of the amplifier.

In some embodiments, some of the units and/or circuits in FIG. 1 can be implemented in hardware, while other units of FIG. 1 can be implemented in software. For example, in some embodiments, the power amplifier circuit 108 is included on a discrete integrated circuit, while the pre-distortion unit 106, power amplifier model 110, comparator 116, and parameter estimation unit 118 are implemented in an application specific integrated circuit (ASIC), or field programmable gate array (FPGA), for example. In other embodiments, the pre-distortion unit 106, power amplifier model 110, comparator 116, and parameter estimation unit 118 are implemented as instructions stored in semiconductor memory and executed on a processor, such as a microprocessor, microcontroller, baseband processor, or digital signal processor. In still other embodiments, all components can be integrated on a single monolithic IC, or in a three dimensional packaged IC made up of multiple dies stacked over one another in an IC package.

Figure 2:
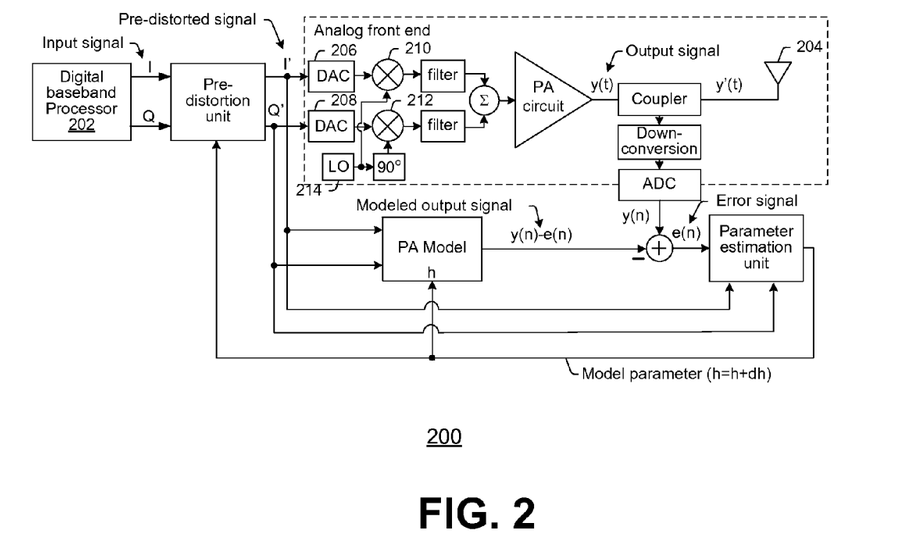
FIG. 2 illustrates a block diagram of a transmission system that uses I-Q data in accordance with some embodiments.

FIG. 2 shows an example where the adaptive pre-distortion techniques are utilized in the context of an IQ transmitter 200. In this example, the input signal has I-data and Q-data components, which are provided in the form of a baseband signal from a baseband processor 202. The output signal y'(t) is wirelessly transmitted from an RF antenna 204. Discrete-time to continuous-time conversion, discrete-amplitude to continuous-amplitude conversion, as well as frequency up-conversion of the pre-distorted signal is achieved by digital-to-analog converters (DAC) (206, 208), I- and Q-mixers (210, 212), and a local oscillator (LO) (214), which provides a LO signal with 90° phase shift between the I- and Q-data paths. While FIG. 2 shows an IQ transmitter, the present adaptive pre-distortion techniques are also applicable to other types of transmitters, such as polar transmitters for example, which are contemplated as falling within the scope of the present disclosure.

Example 1

In order to provide a more detailed example of how the pre-distortion unit 106 and power amplifier model 110 can be implemented in this system 100 and other transmission systems, the following description provides a more rigorous mathematical treatment of the system. In this system, the pre-distortion unit 106 is iteratively tuned to continuously represent the inverse of the power amplifier circuit 108.

In the first step, an initial parameter, h, is provided to the power amplifier model 110, and initial input data x(n) is processed. The model output, y(n)-e(n), obtained with this initial parameter, h, is then compared to the feedback signal, y(n), resulting in error signal vector, e(n). Parameter estimation unit 118 then uses error signal vector, e(n), and the pre-distorted signal vector, z(n) to estimate an updated vector, dh, using a least squares estimator. This can be done by the following matrix operation:

$$dh = (Z^H Z)^{-1} Z^H e \quad (1a)$$

where the matrix Z contains all nonlinear input signal combinations depending on the power amplifier model 110, and the superscript H denotes Hermitian transpose. To stabilize the solution for the vector dh, equation (1a) is regularized by adding a coefficient μ in the following way:

$$dh = (Z^H Z + \mu I)^{-1} Z^H e \quad (1b)$$

where μ can be chosen to trade off residual error and the norm of the solution vector dh. This regularization step helps obtain a "small" (in terms of norm) coefficient vector in order to ensure stability of the pre-distortion unit 106.

If dh is calculated according to (1b), the model parameter vector h can be updated according to:

$$h^{(i+1)} = h^{(i)} + \mu dh \quad (2)$$

which is provided to the power amplifier model 110 and is used to calculate the power amplifier inverse for the pre-distortion unit 106. The parameter μ controls the update speed. As soon as the updated power amplifier inverse is calculated, the parameter, h, is updated for the power amplifier model 110 and the pre-distortion unit 106 to better reflect the actual inverse of the power amplifier circuit 108. The whole procedure is performed within a loop to improve the linearization in an iterative way and to track the amount of pre-distortion used if the behavior of the power amplifier circuit 108 is changing over time.

To obtain good overall linearization performance with the pre-distortion unit 106, the power amplifier model 110 needs to generate a good approximation of the baseband feedback signal, y(n). In general, nonlinear models with or without memory, such as Wiener polynomials, Hammerstein polynomials, memory polynomials, or generalized memory polynomials, can be used for the power amplifier model 110. For the sake of illustration, this disclosure describes the concept with regards to a memory polynomial, which is a good basic model for wideband applications, as follows:

$$\hat{y}(n) = h_{00}z(n) + \sum_{k>0} h_{0k}z(n)|z(n)|^k + \sum_{m>0}\sum_{k} h_{mk}z(n-m)|z(n-m)|^2 \quad (3)$$

In equation (3), $h_{mk}$ denote the elements of the parameter vector, h, which have to be estimated to minimize the squared magnitude of the error signal, e(n), in FIG. 1. The first two terms on the right hand side of equation (3) are memory-less polynomials, and the other terms are memory polynomials. An output of a memory polynomial is not only a function of the current input signal, but is also a function of past input signals and/or output signals; whereas a memory-less polynomials are only a function of the current input signal.

Because the baseband feedback signal y(n) is ideally identical to the input signal, x(n), the left side ŷ(n) of (3) is set equal to the input signal x(n) and equation (3) is re-arranged to yield the pre-distorted signal z(n) according to:

$$z(n) = \frac{1}{h_{00}}\left(x(n) - \underbrace{\sum_{k>0} h_{0k}z(n)|z(n)|^k}_{H1} - \underbrace{\sum_{m>0}\sum_{k} h_{mk}z(n-m)|z(n-m)|^k}_{H2}\right) \quad (4)$$

Thus, the pre-distorted signal z(n), as provided by the pre-distortion unit 106, can be calculated by performing a summation of memory-less polynomials (H1) and memory polynomials (H2).

Figure 3:
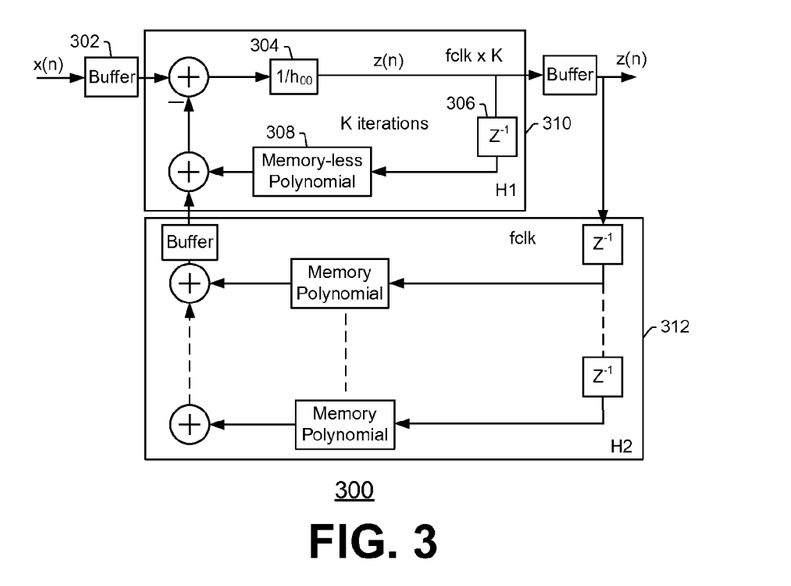
FIG. 3 illustrates a block diagram of a pre-distortion unit in accordance with some embodiments.

As shown in FIG. 3's block diagram, the pre-distorted signal, z(n), of equation (4) can be computed by a pre-distortion unit 300 with nonlinear feedback. The pre-distortion unit 300 can store input signal x(n) in a buffer 302. Coefficient 1/$h_{00}$ (304) can be applied to the buffered input signal in 302. A delay element (buffer) (306) provides the input for the non-memory polynomial processor (308). Since the pre-distorted signal z(n) given by (4) is needed on the right side of (4), z(n) is computed in an iterative fashion. In the first iteration, the (unknown) z(n) on the right side of (4) is replaced by x(n) yielding a first approximation of z(n), which is used in the second iteration instead of z(n) on the right side of (4) and so forth. Because using the pre-distortion signal z(n) to compute the pre-distortion signal z(n) is a non causal operation, the H1 block 310 is running on a clock speed fclk×K. After several iterations (in general, K), z(n) will converge and will be accurate enough to generate the next sample z(n+1), which is again an approximation and which needs again K iterations to obtain accurate results. To perform this recursive operation, the H1 block 310 and H2 block 312 (corresponding to H1 and H2 in equation (4)) run with different clock speeds. H1 block 310 runs at frequency fclk×K, while H2 block 312 runs at frequency fclk (i.e., H1 block 310 runs K times faster than H2 block 312), because pre-distortion unit performs K iterations to determine one sample of the desired pre-distorted signal z(n). Because of this, equation (4) can be re-written in the final form:

$$z^{(j)}(n) = \frac{1}{h_{00}}\left(x(n) - \underbrace{\sum_{k>0} h_{0k}z^{(j-1)}(n)|z^{(j-1)}(n)|^k}_{H1} - \underbrace{\sum_{m}\sum_{k} h_{mk}z(n-m)|z(n-m)|^k}_{H2}\right) \quad (5)$$

where $z^{(0)}(n)=x(n)$, and j is the iteration number to approximate the pre-distorted signal z(n).

Figure 4:
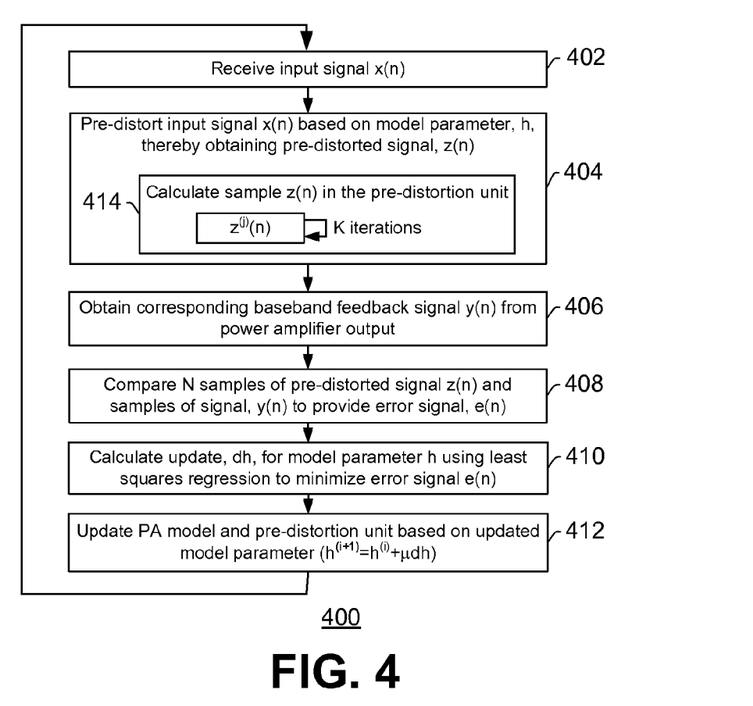
FIG. 4 illustrates a method in flow chart format in accordance with some embodiments.

FIG. 4 depicts the pre-distortion operation as a flow chart 400 to highlight again the nested operations of improving the power amplifier model through 110 and pre-distortion unit 106.

Method 400 begins at 402, wherein an input signal x(n) is received. In some embodiments, the input signal is a digital baseband signal. For example, the input signal can be a complex digital baseband signal in the form of an IQ baseband signal, or can be a digital polar baseband signal.

At 404, the input signal x(n) is pre-distorted based on a model parameter, h, thereby obtaining the pre-distorted signal, z(n). Within block 404, at 414, a sample for the pre-distortion signal z(n) is calculated in the pre-distortion unit. The sample is iteratively calculated over K iterations to provide a good approximation of the inverse of the power amplifier circuit.

At 406, the pre-distorted signal is amplified signal using a power amplifier circuit after digital-to-analog conversion and up-conversion, thereby providing the baseband feedback signal y(n) through coupling, down-conversion, and analog-to-digital conversion.

At 408, N samples of a modeled output signal or the pre-distorted signal z(n) are compared to N samples of the baseband feedback signal, y(n) to provide an error signal, e(n). The error signal represents a difference between the compared signals.

At 410, an update, dh, for model parameter h is calculated using least-squares estimation to minimize error signal e(n).

At 412, the power amplifier model and the pre-distortion unit are updated based on the updated model parameter ($h^{(i+1)}=h^{(i)}+\mu dh$).

Example 2

In the pre-distortion unit 300 illustrated in FIG. 3 and the corresponding equations (3) to (5), this disclosure considered memory polynomials for the modeling. Memory polynomials incorporate memory only along the diagonals of the general Volterra kernel, which can limit the achievable linearization performance especially in more complicated high efficiency power amplifier architectures, such as a Doherty architecture for example. Therefore, the present disclosure also provides a flexible architecture capable of realizing a class of powerful models described by:

$$\hat{y}(n) = h_{000}z(n) + z(n)\left(L_0(|z(n)|) + \sum_g L_g(|z(n-g)|)\right) +$$
$$p(z(n-1), \ldots, z(n-M-G))$$

where $L_i$ are coefficient-dependent operators and the last term depends only on input samples from the past. As an example, the well-known generalized memory polynomial (GMP) model can be mapped onto this architecture. Furthermore it can be advantageous to employ segmentwise piecewise polynomial approximation onto this architecture. The segmentwise piecewise polynomial model can be written as follows:

$$\hat{y}(n) = h_{000}z(n) + z(n)\sum_k h_{00k}||z(n)| - \beta_k| + \qquad (6)$$
$$z(n)\sum_g \sum_k h_{0gk}||z(n-g)| - \beta_k| + p(z(n-1), \ldots, z(n-M-G))$$

Equation (6) can be re-arranged similarly to the memory polynomial model and can be mapped onto this architecture, thereby obtaining the following approximation for the pre-distorted signal:

$$z^{(j)}(n) = \frac{1}{h_{000}}\left[x(n) - z^{(j-1)}(n)\left\{L_0(|z^{(j-1)}(n)|) - \sum_g L_g(|z(n-g)|)\right\} - \qquad (7)$$
$$p(z(n-1), \ldots z(n-m-G))\right]$$

where the operators L describe the sum expressions in equation (6). The operators L can be implemented as functions or look up tables.

Figure 5:
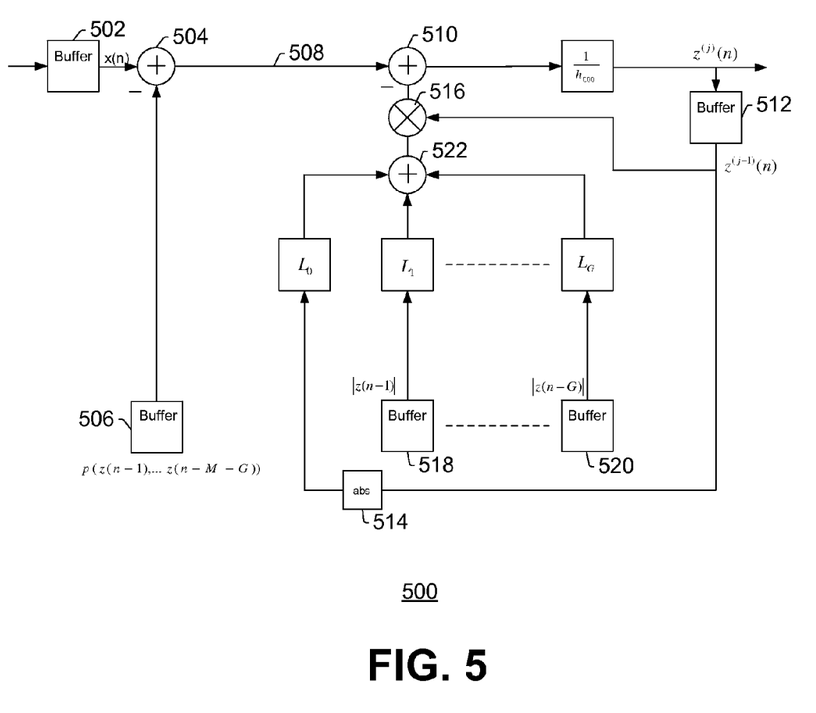
FIG. 5 illustrates a block diagram of a pre-distortion unit that uses a segment-wise piecewise approximation in accordance with some embodiments.

FIG. 5 depicts a pre-distortion unit architecture 500 described by equation (7). In FIG. 5, an input signal x(n) is received at buffer 502. A first summation element 504 applies the input signal to a first set of polynomials, which are stored in buffer 506. The resultant signal at 508 is provided to second summation element 510, which will provide the pre-distorted signal $z^j(n)$. To keep the pre-distorted signal tuned to represent the inverse of the power amplifier, the pre-distorted signal is buffered at 512, and then provided to an absolute value determination element 514 as well as a multiplier or mixer 516. The absolute value (or magnitude) of $z^j(n)$ is then applied to the first operator L0. Other operators L1, Lg, which are stored in buffers 518, ..., 520, respectively, are also taken into account at third summation element 522. The result is a segment-wise piece-wise polynomial approximation that provides good linearity for the transmission system.

While the methods illustrated herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of systems which are illustrated and described herein as well as in association with other systems not illustrated, wherein all such implementations are contemplated as falling within the scope of the present invention and the appended claims.

Although the invention has been illustrated and described with respect to one or more implementations, alterations and/or modifications may be made to the illustrated examples without departing from the spirit and scope of the appended claims.

In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (or another functionally equivalent embodiment), even though not structurally equivalent to the disclosed structure which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising". In addition, to the extent that the terms "number", "plurality", "series", or variants thereof are used in the detailed description or claims, such terms are to include any number including, but not limited to: positive integers, negative integers, zero, and other values.

What is claimed is:

1. A system, comprising:
  a pre-distortion unit configured to pre-distort an input signal based on a model parameter by directly computing an inverse of a power amplifier model in an iterative fashion and configured to alternate between computing the inverse and updating the model parameter, thereby providing a pre-distorted signal, wherein the pre-distortion unit calculates the pre-distorted signal according to the following function:

$$z(n) = \frac{1}{h_{00}}\left(x(n) - \sum_{k>0} h_{0k}z(n)|z(n)|^k - \sum_{m>0}\sum_k h_{mk}z(n-m)|z(n-m)|^k\right)$$

where $h_{00}$, $h_{0k}$, and $h_{mk}$ are coefficients and x(n) represents the input signal;
  a power amplifier circuit configured to amplify the pre-distorted signal;
  wherein the power amplifier model is configured to model amplification of the pre-distorted signal by the power amplifier circuit based on the pre-distorted signal and the model parameter; and
  a parameter-estimation unit configured to update the model parameter provided to the pre-distortion unit and the power amplifier model based on the pre-distorted signal and an error signal, wherein the error signal represents a difference between an output signal from the power amplifier circuit and a modeled output signal from the power amplifier model, and configured to iteratively update the model parameter by alternating between updating the model parameter and computing the inverse of the power amplifier model by the pre-distortion unit.

2. The system of claim 1, wherein the parameter estimation unit is arranged on a feedback path which couples an output of the power amplifier circuit to both an input of the pre-distortion unit and an input of the power amplifier model.

3. The system of claim 2, further comprising:
a comparator arranged on the feedback path and having a first comparator input coupled to the output of the power amplifier circuit, a second comparator input coupled to an output of the power amplifier model, and a comparator output to provide the error signal to an input of the parameter estimation unit.

4. The system of claim 1, wherein the input signal is a complex digital baseband signal.

5. The system of claim 1:
wherein an amplification characteristic of the power amplifier circuit changes in non-linear fashion due to changes in a magnitude of the input signal; and
wherein the error signal changes the model parameter to keep a magnitude of the output signal provided at an output of the power amplifier circuit substantially linear with respect to the magnitude of the input signal.

6. The system of claim 1, wherein the model parameter is provided directly to the pre-distortion unit and directly to the power amplifier model from the parameter estimation unit.

7. The system of claim 1, further comprising:
a unit that provides a set of amplitude segments, which adjoin one another at amplitude-segment boundaries, to the system;
wherein the model parameter is updated for each amplitude segment, and wherein the pre-distortion unit and power amplifier model use polynomials within the amplitude segments where the polynomial order can vary from amplitude segment to amplitude segment depending on the behavior of the amplifier.

8. The system of claim 1, wherein the pre-distortion unit calculates the pre-distorted signal according to a sum of memory polynomials and memoryless polynomials which are tuned based on the model parameter.

9. The system of claim 8, wherein the memoryless polynomials are calculated using a first clock having a first clock frequency and wherein the memory polynomials are calculated using a second clock having a second clock frequency, the first clock frequency being greater than the second clock frequency.

10. A system, comprising:
a pre-distortion unit configured to pre-distort an input signal based on a model parameter, thereby providing a pre-distorted signal, wherein the pre-distortion unit calculates the pre-distorted signal according to a sum of memory polynomials and memoryless polynomials which are tuned based on the model parameter, wherein the memoryless polynomials are calculated using a first clock having a first clock frequency and wherein the memory polynomials are calculated using a second clock having a second clock frequency, the first clock frequency being greater than the second clock frequency;
a frequency up-conversion element to up-convert a frequency of the pre-distorted signal, thereby providing an up-converted pre-distorted signal;
a power amplifier circuit configured to amplify the up-converted pre-distorted signal, thereby providing an up-converted output signal;
a power amplifier model configured to model the amplification of the up-converted pre-distorted signal by the power amplifier based on the pre-distorted signal and the model parameter; and
a feedback path coupling an output of the power amplifier circuit to the pre-distortion unit and power amplifier model, wherein the feedback path comprises:
a down-conversion element to down-convert the up-converted output signal, thereby providing a down-converted output signal;
wherein the feedback path is configured to update the model parameter based on a difference between the down-converted output signal and a modeled amplified output signal from the power amplifier model.

11. The system of claim 10, wherein the model parameter is provided directly to the pre-distortion unit and directly to the power amplifier model from a parameter estimation unit located on the feedback path.

12. The system of claim 10, wherein the feedback path comprises:
a parameter estimation unit configured to update the model parameter based on both the pre-distorted signal and an error signal, wherein the error signal is representative of the difference between the down-converted output signal and the modeled amplified output signal.

13. The system of claim 12, wherein the feedback path further comprises:
a comparator arranged on the feedback path and having a first comparator input coupled to an output of the power amplifier circuit, a second comparator input coupled to an output of the power amplifier model, and a comparator output to provide the error signal to an input of the parameter estimation unit.

14. The system of claim 10, wherein the pre-distortion unit calculates the pre-distorted signal according to the following function:

$$z(n) = \frac{1}{h_{00}}\left(x(n) - \sum_{k>0} h_{0k} z(n)|z(n)|^k - \sum_{m>0}\sum_{k} h_{mk} z(n-m)|z(n-m)|^k\right)$$

where $h_{00}$, $h_{0k}$, and $h_{mk}$ are coefficients, and $x(n)$ represents the input signal.

15. The system of claim 10, wherein the pre-distortion unit calculates the pre-distorted signal according to the following function:

$$z^{(j)}(n) = \frac{1}{h_{000}}\left[x(n) - z^{(j-1)}(n)\left\{L_0(|z^{(j-1)}(n)|) - \sum_{g} L_g(|z(n-g)|)\right\} - p(x(n-1), \ldots x(n-m-G))\right]$$

where $x(n)$ represents the input signal.

16. The system of claim 10, wherein the input signal is a complex digital baseband signal.

17. The system of claim 10:
wherein an amplification characteristic of the power amplifier circuit changes in non-linear fashion due to changes in a magnitude of the input signal; and
wherein the error signal changes the model parameter to keep a magnitude of the output signal provided at an output of the power amplifier circuit substantially linear with respect to the magnitude of the input signal.

18. A system, comprising:
a pre-distortion unit configured to pre-distort an input signal based on a model parameter, thereby providing a pre-distorted signal, wherein the pre-distortion unit calculates the pre-distorted signal according to a sum of memory polynomials and memoryless polynomials which are tuned based on the model parameter, wherein the memoryless polynomials are calculated using a first clock having a first clock frequency and wherein the memory polynomials are calculated using a second clock having a second clock frequency, the first clock frequency being greater than the second clock frequency;
a non-linear circuit configured to process the pre-distorted signal;
a non-linear circuit model configured to model the processing of the pre-distorted signal by the non-linear circuit based on the pre-distorted signal and the model parameter; and
a feedback path coupling an output of the non-linear circuit to the pre-distortion unit and non-linear circuit model, wherein the feedback path is configured to update the model parameter based on a difference between an output signal from the non-linear circuit and a modeled output signal from the non-linear circuit model, and provide the updated model parameter directly to the pre-distortion unit and directly to the non-linear circuit model from a parameter estimation unit located on the feedback path.

19. A method of wireless data transmission, comprising:
receiving an input signal;
pre-distorting the input signal based on a model parameter, h, thereby obtaining a pre-distorted signal, wherein the pre-distorted signal is calculated according to the following function:

$$z^{(j)}(n) = \frac{1}{h_{000}}\left[x(n) - z^{(j-1)}(n)\left\{L_0(|z^{(j-1)}(n)|) - \sum_g L_g(|z(n-g)|)\right\} - p(x(n-1), \ldots x(n-m-G))\right]$$

where x(n) represents the input signal;
amplifying the pre-distorted signal using a power amplifier circuit, thereby providing an output signal;
comparing samples of a modeled output signal to samples of the output signal to provide an error signal, wherein the error signal represents a difference between the samples of the modeled output signal and the samples of the output signal;
updating the model parameter using a least-squares estimation to minimize the error signal; and
updating both the modeled output signal and the pre-distorted signal based on the updated model parameter.

20. The method of claim 19, wherein updating the model parameter is updated by iteratively approximating an inverse of the power amplifier circuit by estimating a memoryless polynomial over K iterations and estimating a memory polynomial over M iterations, wherein K is greater than M.

* * * * *